United States Patent
Oganesian et al.

(10) Patent No.: US 8,686,565 B2
(45) Date of Patent: Apr. 1, 2014

(54) STACKED CHIP ASSEMBLY HAVING VERTICAL VIAS

(75) Inventors: Vage Oganesian, Palo Alto, CA (US); Belgacem Haba, Saratoga, CA (US); Ilyas Mohammed, Santa Clara, CA (US); Craig Mitchell, San Jose, CA (US); Piyush Savalia, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 591 days.

(21) Appl. No.: 12/883,431

(22) Filed: Sep. 16, 2010

(65) Prior Publication Data

US 2012/0068352 A1 Mar. 22, 2012

(51) Int. Cl.
 *H01L 23/48* (2006.01)
 *H01L 21/50* (2006.01)

(52) U.S. Cl.
 USPC ........... 257/774; 257/200; 257/621; 257/777; 257/E21.001; 257/E21.449; 257/E21.597; 257/E23.011; 257/E23.141

(58) Field of Classification Search
 USPC .................. 257/200, 621, 774, 777, E21.001, 257/E21.499, E21.597, E23.011, E23.141
 See application file for complete search history.

(56) References Cited

U.S. PATENT DOCUMENTS

| | | | |
|---|---|---|---|
| 5,481,133 A | 1/1996 | Hsu | |
| 6,582,991 B1 | 6/2003 | Maeda et al. | |
| 6,812,549 B2 | 11/2004 | Umetsu et al. | |
| 2004/0016942 A1 | 1/2004 | Miyazawa et al. | |
| 2004/0188822 A1 | 9/2004 | Hara | |
| 2005/0156330 A1 | 7/2005 | Harris | |
| 2005/0287783 A1 | 12/2005 | Kirby et al. | |
| 2007/0037379 A1* | 2/2007 | Enquist et al. | 438/618 |
| 2007/0126085 A1 | 6/2007 | Kawano et al. | |
| 2007/0126121 A1* | 6/2007 | Shue et al. | 257/774 |
| 2007/0269931 A1 | 11/2007 | Chung et al. | |
| 2008/0284041 A1 | 11/2008 | Jang et al. | |
| 2009/0032966 A1 | 2/2009 | Lee et al. | |
| 2009/0065907 A1 | 3/2009 | Haba et al. | |
| 2009/0121323 A1* | 5/2009 | Kwon et al. | 257/621 |

(Continued)

FOREIGN PATENT DOCUMENTS

| | | |
|---|---|---|
| DE | 19516487 C1 | 7/1996 |
| EP | 1801866 A2 | 6/2007 |

(Continued)

OTHER PUBLICATIONS

International Search Report and Written Opinion from PCT/US2010/000777, dated Nov. 19, 2010.

(Continued)

*Primary Examiner* — Matthew W Such
*Assistant Examiner* — David Spalla
(74) *Attorney, Agent, or Firm* — Lerner, David, Littenberg, Krumholz & Mentlik, LLP

(57) ABSTRACT

An assembly and method of making same are provided. The assembly can be formed by stacking a first semiconductor element atop a second semiconductor element and forming an electrically conductive element extending through openings of the semiconductor elements. The openings may be staged. The conductive element can conform to contours of the interior surfaces of the openings and can electrically connect conductive pads of the semiconductor elements. A dielectric region can be provided at least substantially filling the openings of the semiconductor elements, and the electrically conductive element can extend through an opening formed in the dielectric region.

50 Claims, 20 Drawing Sheets

(56) References Cited

U.S. PATENT DOCUMENTS

| | | |
|---|---|---|
| 2009/0166840 A1 | 7/2009 | Kang et al. |
| 2009/0309235 A1 | 12/2009 | Suthiwongsunthorn et al. |
| 2010/0044869 A1* | 2/2010 | Zhang et al. .................. 257/773 |

FOREIGN PATENT DOCUMENTS

| | | |
|---|---|---|
| JP | 2001217386 A | 8/2001 |
| KR | 20060020822 A | 3/2006 |
| WO | 2009017758 A2 | 2/2009 |
| WO | 2009017835 A2 | 2/2009 |
| WO | 2009023462 A1 | 2/2009 |
| WO | 2010104610 A2 | 9/2010 |

OTHER PUBLICATIONS

International Search Report and Written Opinion, PCT/US2008/009356, dated Feb. 19, 2009.
Office Action from U.S. Appl. No. 12/221,204, dated Jun. 10, 2010.
Office Action from U.S. Appl. No. 12/221,204, dated Apr. 28, 2011.

* cited by examiner

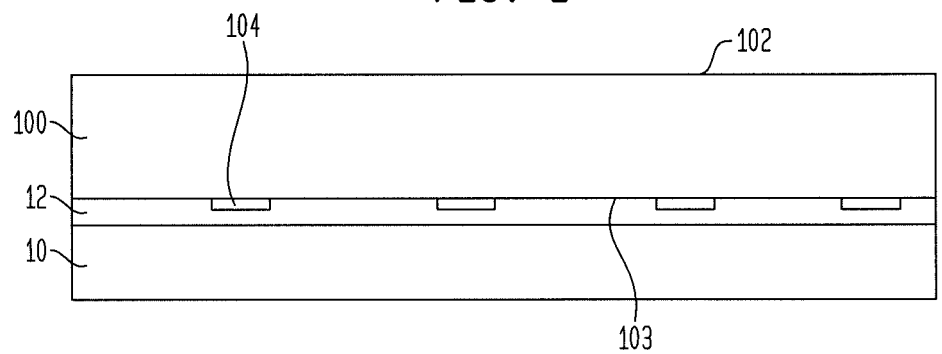
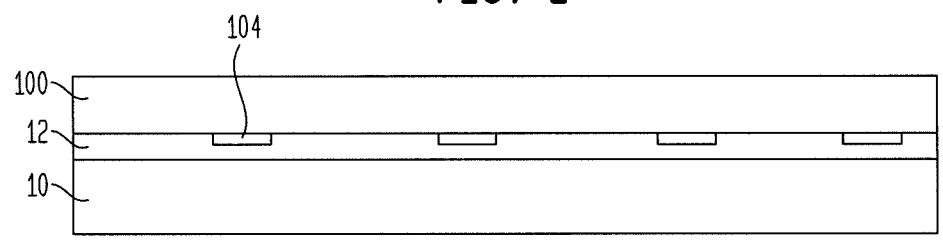
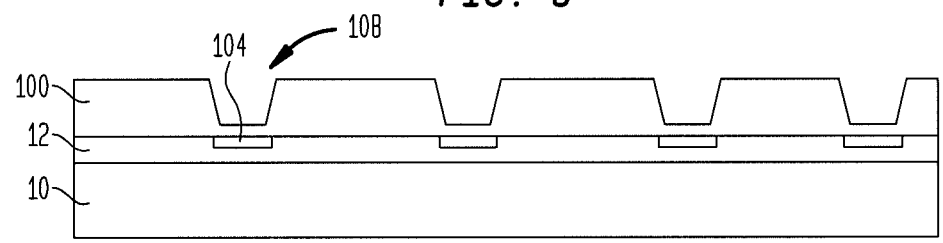
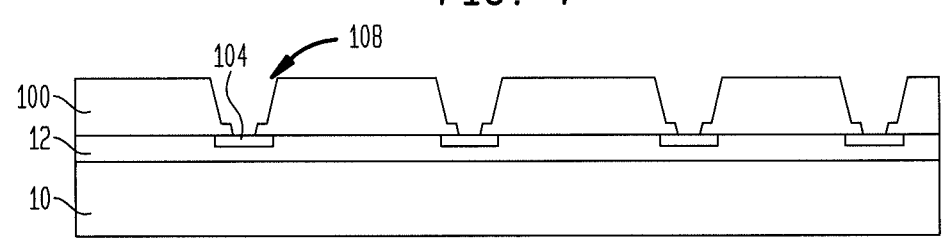

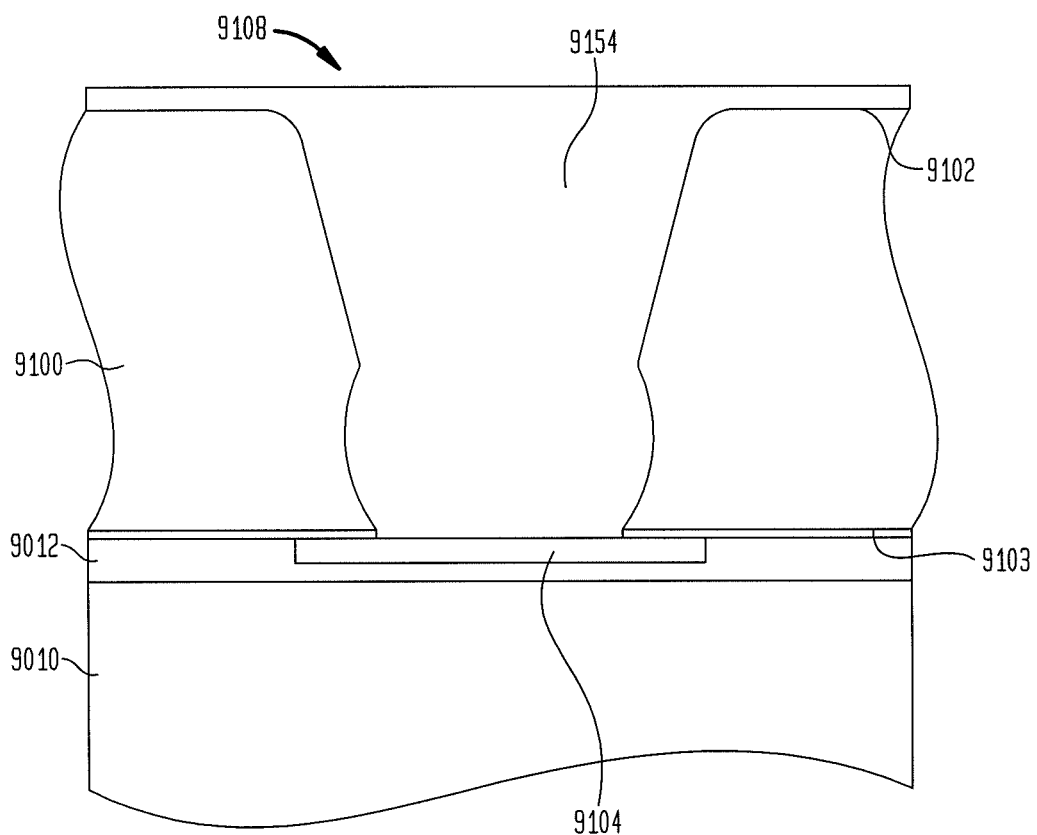

STACKED CHIP ASSEMBLY HAVING VERTICAL VIAS

BACKGROUND OF THE INVENTION

The present invention relates to packaging of microelectronic devices, especially the packaging of semiconductor devices.

Three-dimensional chip stacking can be done in a variety of ways. In some examples, chips can be wire-bonded with spacers therebetween, the chips can be staggered with respect to each other or both. In some cases, chips can include through silicon vias which extend between the front and rear surfaces thereof for electrical connection at the front and rear surfaces to other chips.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Further improvements can be made to stacked semiconductor element assemblies using through silicon vias.

BRIEF SUMMARY OF TEE INVENTION

A first aspect of the present invention is a method of forming a stacked microelectronic assembly comprising the steps of (a) stacking a first semiconductor element atop a second semiconductor element, each of the first and second semiconductor elements having a front surface, a rear surface remote from the front surface, and a conductive pad exposed at the front surface, a first opening extending from the rear surface towards the front surface, and a second opening extending from the first opening at least to the respective conductive pad, the first and second openings having respective interior surfaces extending at angles relative to each other, wherein at least the second opening of the first semiconductor element extends through the conductive pad of the first semiconductor element, and the conductive pad of the first semiconductor element overlies the conductive pad of the second semiconductor element; and (b) forming an electrically conductive element extending through the first and second openings of each of the first and second semiconductor elements, the conductive element conforming to contours of the interior surfaces of the first and second openings and electrically connecting the conductive pads.

In accordance with certain embodiments of this first aspect, each of the conductive pads of the first and second semiconductor elements may have a bottom surface adjacent the second opening of the respective semiconductor element, and each of the conductive element may contact the bottom surface of the respective conductive pad. The conductive pad of at least the first semiconductor element may have an inner surface exposed within the second opening, the inner surface extending from a bottom surface of the conductive pad adjacent the second opening to a top surface thereof remote from the bottom surface, wherein the conductive element contacts the inner surface of the conductive pad of at least the first semiconductor element. A dielectric material may at least partly overlie the interior surfaces of the first and second openings of each of the first and second semiconductor elements. The dielectric material may be a polymeric material.

Step (b) may include removing a portion of the dielectric material by a method including at least one of: mechanical milling, sandblasting, or directing a laser toward at least a portion of the interior surfaces of the first and second openings to ablate a portion of the dielectric material and a portion of a sacrificial layer. Step (b) may include filling the first and second openings of each of the first and second semiconductor elements with the electrically conductive element. Step (b) may include forming a metal layer lining the first and second openings of the second semiconductor element, and forming a dielectric layer overlying the metal layer within the first and second openings, the metal layer extending at least partially through the conductive pad of the second semiconductor element. The metal layer may extend through the entire thickness of the conductive pad of the second semiconductor element. At least the first semiconductor element may have a plurality of active semiconductor devices disposed therein. The second semiconductor element may have a plurality of active semiconductor devices disposed therein.

A second aspect of the present invention is a method of forming a stacked microelectronic assembly comprising the steps of (a) stacking a first semiconductor element atop a second semiconductor element, each of the first and second semiconductor elements having a front surface, a rear surface remote from the front surface, and a conductive pad exposed at the front surface, a first opening extending from the rear surface towards the front surface, and a second opening extending from the first opening at least to the respective conductive pad, the first and second openings having respective interior surfaces extending at angles relative to each other, and a dielectric region at least substantially filling the first and second openings, wherein the conductive pad of the first semiconductor element overlies the conductive pad of the second semiconductor element; (b) forming a third opening extending through the dielectric region within the first and second openings and extending through the conductive pad of at least the first semiconductor element; and (c) forming an electrically conductive element extending through the third opening, the conductive element electrically connecting the conductive pads.

In accordance with certain embodiments of this second aspect, the conductive pad of at least the first semiconductor element may have an inner surface exposed within the second opening, the inner surface extending from a bottom surface of the conductive pad adjacent the second opening to a top surface thereof remote from the bottom surface, the conductive element contacting the inner surface of the conductive pad of at least the first semiconductor element. At least a portion of the conductive element may not conform to a contour of the respective interior surfaces of the first and second openings in the respective first and second semiconductor elements. The dielectric region may be a polymeric material.

Step (b) may include removing a portion of the dielectric region by a method including at least one of: mechanical milling, sandblasting, or directing a laser toward at least a portion of the interior surfaces of the first and second openings to ablate a portion of the dielectric material and a portion of a sacrificial layer. Step (c) may include filling the third opening with the electrically conductive element. Step (c) may include forming a metal layer lining the third opening, and forming a dielectric layer overlying the metal layer within the third opening, the metal layer extending at least partially through the conductive pad of the second semiconductor element. The metal layer may extend through the entire thickness of the conductive pad of the second semiconductor element. At least the first semiconductor element may have a plurality of active semiconductor devices disposed therein. The second semiconductor element may have a plurality of active semiconductor devices disposed therein.

A third aspect of the present invention is a method of forming a stacked microelectronic assembly comprising the steps of (a) stacking a first semiconductor element atop a second semiconductor element, each of the first and second semiconductor elements having a front surface, a rear surface remote from the front surface, and a conductive pad exposed at the front surface and separated from a semiconductor layer of the semiconductor element by a dielectric layer, a first opening extending from the rear surface towards the front surface, and a second opening extending from the first opening and exposing a portion of the dielectric layer adjacent to the respective conductive pad, the first and second openings having respective interior surfaces extending at angles relative to each other, wherein at least the second opening of the first semiconductor element extends through the conductive pad of the first semiconductor element, and the conductive pad of the first semiconductor element overlies the conductive pad of the second semiconductor element; and (b) forming an electrically conductive element extending through the first and second openings of each of the first and second semiconductor elements, the conductive element conforming to contours of the interior surfaces of the first and second openings and electrically connecting the conductive pads.

A fourth aspect of the present invention is an assembly comprising a first semiconductor element stacked atop a second semiconductor element, each of the first and second semiconductor elements having a front surface, a rear surface remote from the front surface, and a conductive pad exposed at the front surface, a first opening extending from the rear surface towards the front surface, and a second opening extending from the first opening at least to the respective conductive pad, the first and second openings having respective interior surfaces extending at angles relative to each other, wherein at least the second opening of the first semiconductor element extends through the conductive pad of the first semiconductor element, and the conductive pad of the first semiconductor element overlies the conductive pad of the second semiconductor element; and an electrically conductive element extending through the first and second openings of each of the first and second semiconductor elements, the conductive element conforming to contours of the interior surfaces of the first and second openings and electrically connecting the conductive pads.

In accordance with certain embodiments of this fourth aspect, each of the conductive pads of the first and second semiconductor elements may have a bottom surface adjacent the second opening of the respective semiconductor element, and each of the conductive element may contact the bottom surface of the respective conductive pad. The conductive pad of at least the first semiconductor element may have an inner surface exposed within the second opening, the inner surface extending from a bottom surface of the conductive pad adjacent the second opening to a top surface thereof remote from the bottom surface, wherein the conductive element contacts the inner surface of the conductive pad of at least the first semiconductor element.

A dielectric material may at least partly overlie the interior surfaces of the first and second openings of each of the first and second semiconductor elements. The dielectric material may be a polymeric material. The electrically conductive element may substantially fill the first and second openings of each of the first and second semiconductor elements. The assembly may further include a metal layer lining the first and second openings of the second semiconductor element, and a dielectric layer overlying the metal layer within the first and second openings, the metal layer extending at least partially through the conductive pad of the second semiconductor element. The metal layer may extend through the entire thickness of the conductive pad of the second semiconductor element. The second semiconductor element may include a plurality of active semiconductor devices. A system may be provided including an assembly as described above and one or more other electronic components electrically connected to the assembly. The system may further include a housing, the assembly and the other electronic components being mounted to the housing.

A fifth aspect of the present invention is an assembly comprising a first semiconductor element stacked atop a second semiconductor element, each of the first and second semiconductor elements having a front surface, a rear surface remote from the front surface, and a conductive pad exposed at the front surface, a first opening extending from the rear surface towards the front surface, and a second opening extending from the first opening at least to the respective conductive pad, the first and second openings having respective interior surfaces extending at angles relative to each other, the conductive pad of the first semiconductor element overlying the conductive pad of the second semiconductor element; a dielectric region at least substantially filling the first and second openings; a third opening extending through the dielectric region within the first and second openings and extending through the conductive pad of at least the first semiconductor element; and an electrically conductive element extending through the third opening, the conductive element electrically connecting the conductive pads.

In accordance with certain embodiments of this fifth aspect, the conductive pad of at least the first semiconductor element may have an inner surface exposed within the second opening, the inner surface extending from a bottom surface of the conductive pad adjacent the second opening to a top surface thereof remote from the bottom surface, the conductive element contacting the inner surface of the conductive pad of at least the first semiconductor element. At least a portion of the conductive element may not conform to a contour of the respective interior surfaces of the first and second openings in the respective first and second semiconductor elements. The dielectric region may be a polymeric material.

The electrically conductive element may substantially fill the third opening. The assembly may further comprise a metal layer lining the third opening, and a dielectric layer overlying the metal layer within the third opening, the metal layer extending at least partially through the conductive pad of the second semiconductor element. The metal layer may extend through the entire thickness of the conductive pad of the second semiconductor element. The second semiconductor element may include a plurality of active semiconductor devices. A system may be provided including an assembly as described above and one or more other electronic components electrically connected to the assembly. The system may further include a housing, the assembly and the other electronic components being mounted to the housing.

BRIEF DESCRIPTION OF TEE DRAWINGS

FIGS. 1-8, 8*a*, 9, 9*a*, 10, and 10*a* are front perspective views of an assembly showing various steps of making a structure in accordance with the present invention.

Figure 24:
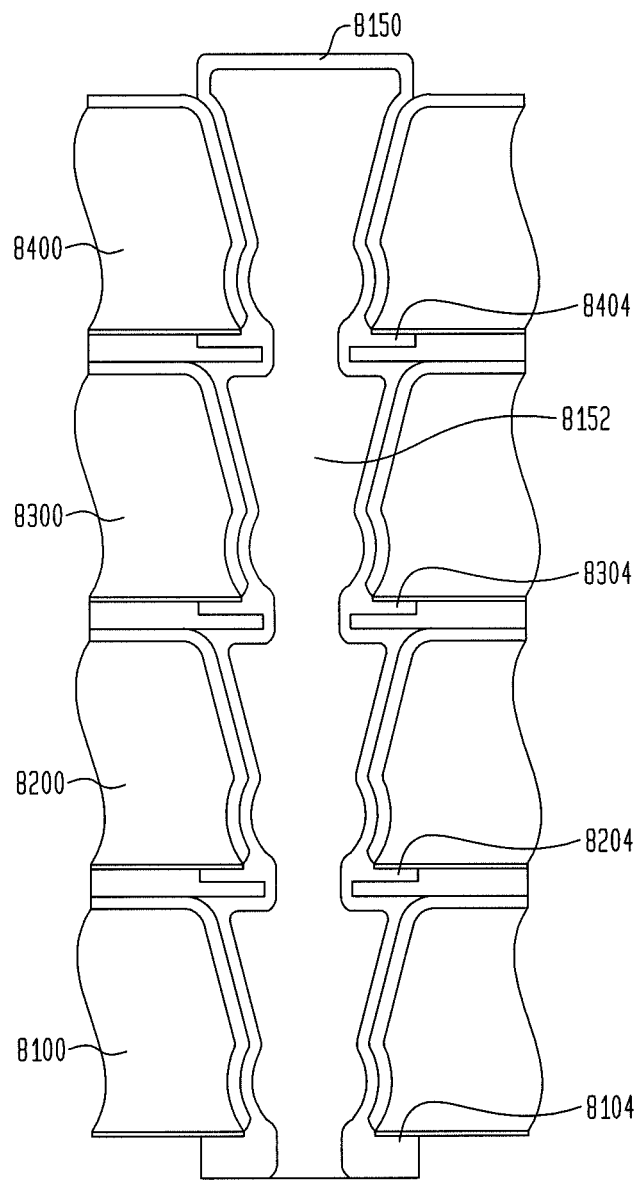
FIG. 24 is a front perspective view of the assembled structure of FIGS. 20-23.
Figure 24A:
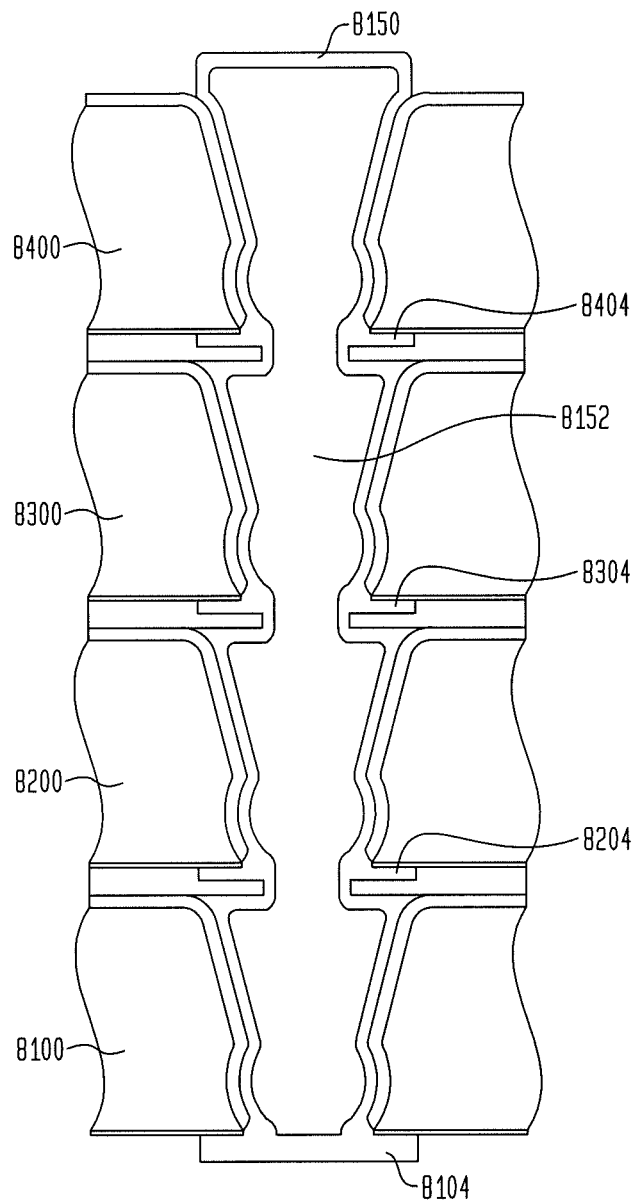

FIG. 24*a* is a front perspective views of an alternative to the structure shown in FIG. 24*a*.

Figure 26:
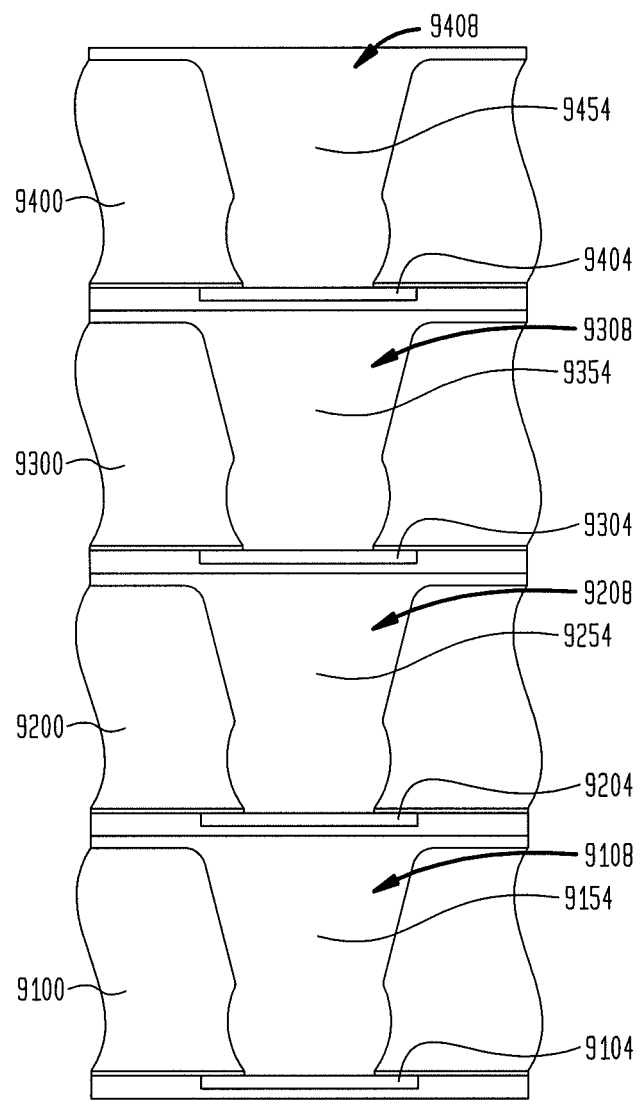
Figure 27:
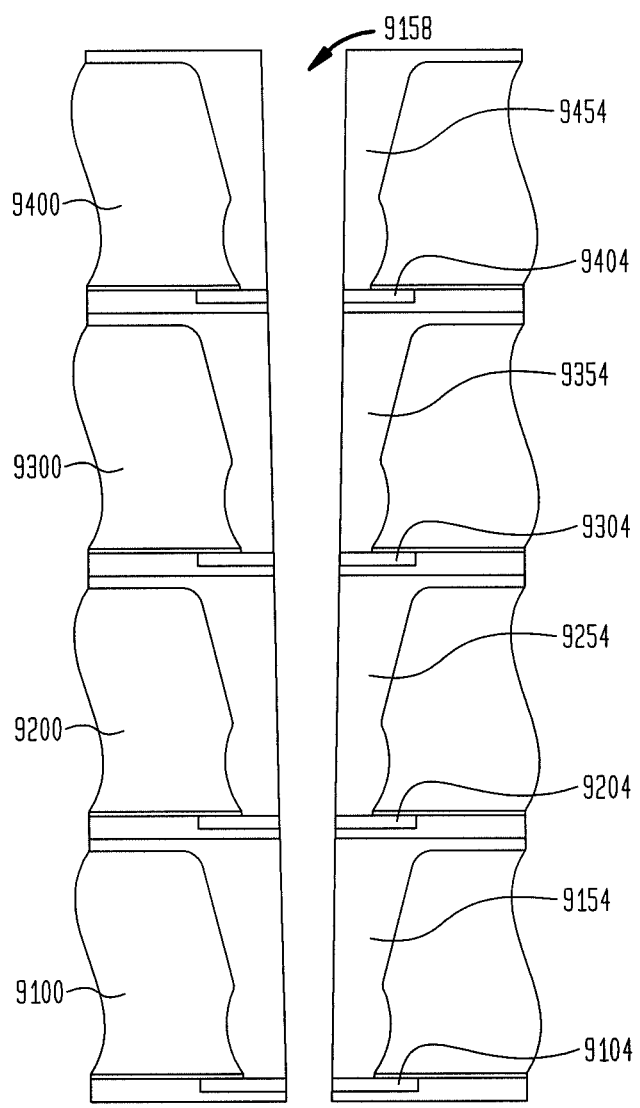

FIGS. 25-27 are front perspective views of an assembly showing various steps of making a structure in accordance with another embodiment of the present invention.

Figure 28:
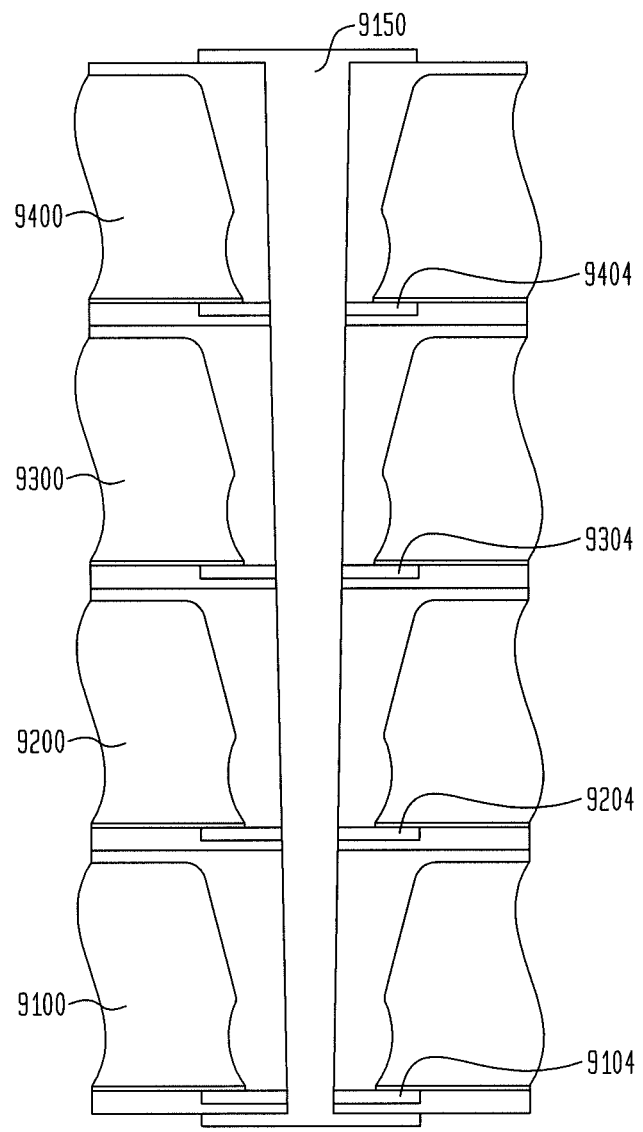

FIG. 28 is a front perspective view of the assembled structure of FIGS. 25-27.

Figure 29:
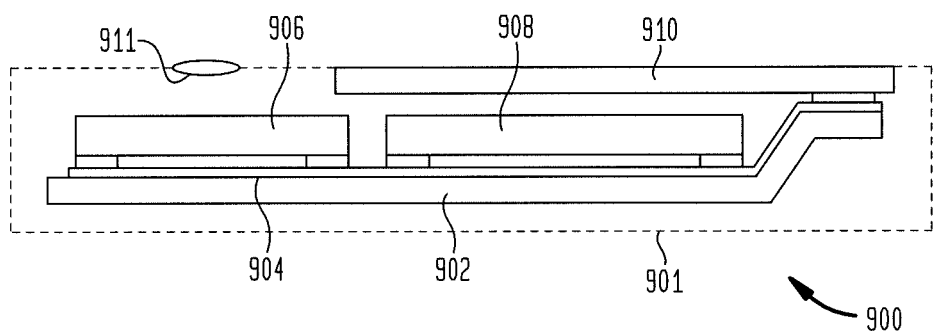

FIG. 29 is a schematic depiction of a system according to one embodiment of the invention.

DETAILED DESCRIPTION

As used in this disclosure, a statement that an electrically conductive element is "exposed at" a surface of a dielectric element indicates that the electrically conductive element is available for contact with a theoretical point moving in a direction perpendicular to the surface of the dielectric element toward the surface of the dielectric element from outside the dielectric element. Thus, a terminal or other conductive element which is exposed at a surface of a dielectric element may project from such surface; may be flush with such surface; or may be recessed relative to such surface and exposed through a hole or depression in the dielectric.

Figure 14:
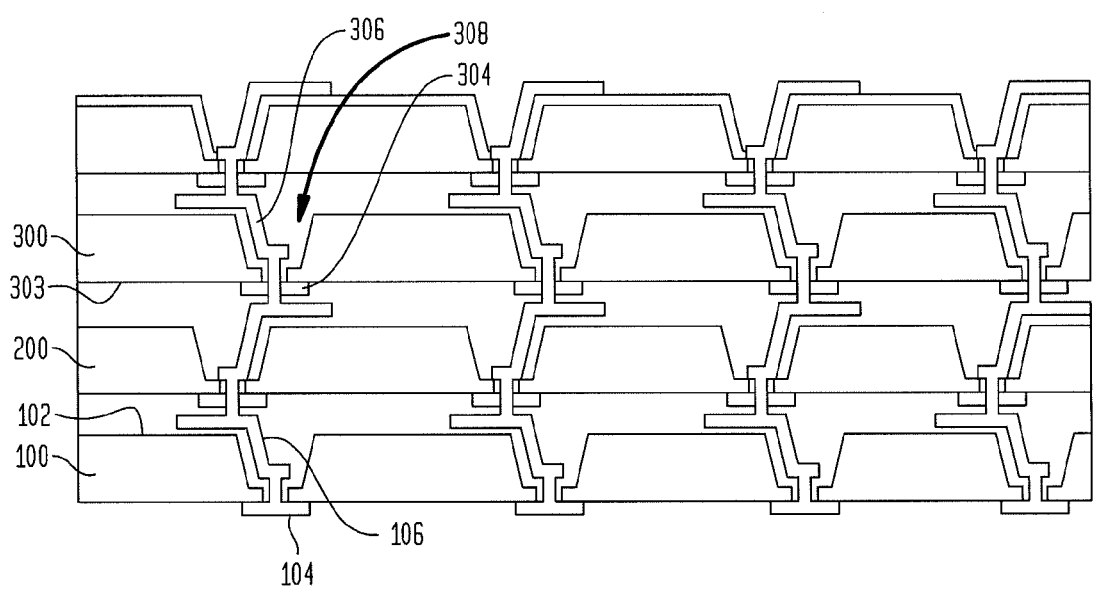
FIG. 14 is a front perspective view of the assembled structure of FIGS. 1-8, 8*a*, 9, 9*a*, 10, and 10*a*.

A first embodiment of a semiconductor element package 90, shown in FIG. 14, will be herein described according to its method of construction. A semiconductor element 100, such as a wafer or portion thereof, is shown in FIG. 1 having a major, or rear, surface 102 and a front surface 103. The semiconductor element, i.e., wafer, or wafer portion, includes one or more semiconductor chips which can be attached together at peripheral edges thereof. An electrically conductive pad is exposed at front surface 103. A carrier layer 10 is attached to the semiconductor element through an adhesive 12. Semiconductor element 100 is thinned, as shown in FIG. 2, and then one or more openings 108 can be formed in element 100, such as by etching, laser ablation, sandblasting, i.e., directing a stream of particles towards major surface 102, such as described in U.S. application Ser. No. 12/842,612 or by other means. FIG. 3 shows element 100 having four openings 108, though any number of openings is possible based on the dimensional limitations of element 100. Opening 108 extends from major surface 102 toward front surface 103, but initially terminates prior to reaching pad 104. As shown in FIG. 4, in one example, the opening 108 can be extended with a narrower dimension to expose pad 104. Opening 108 may have a continuous contour extending between major surface 102 and front surface 103, or may have a plurality of steps therebetween.

Figure 5:
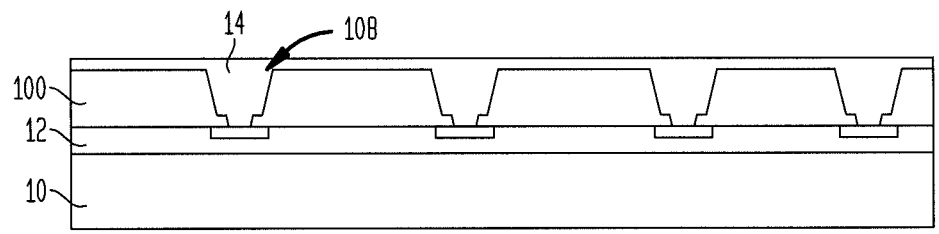
Figure 6:
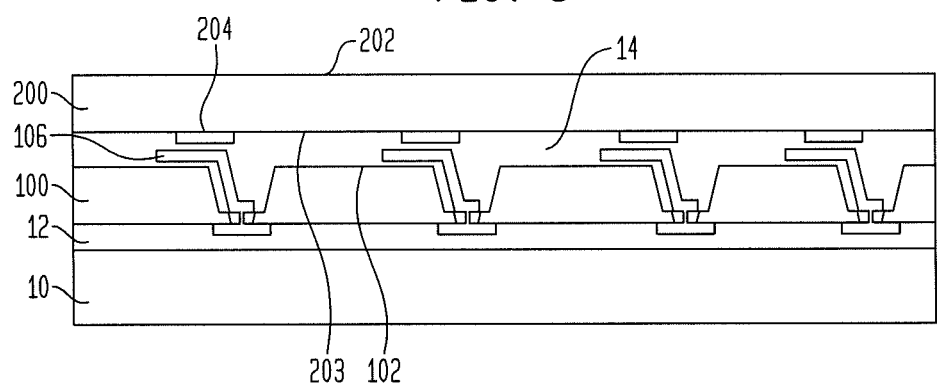

A dielectric layer 14, which may be an adhesive, can be positioned to overlie major surface 102, as shown in FIG. 5. FIG. 6 shows an electrically conductive element 106 juxtaposed to overlie major surface 102 of element 100, where conductive element 106 is electrically connected to pad 104 through opening 108 in element 100. Conductive element 106 may include an electrically conductive trace, a conductive pad, or a combination thereof. Within the opening 108, the conductive element 106 can be in shape of a trace, or can cover a portion or all of an interior surface of each opening 108. A second semiconductor element 200, having a construction similar to that of semiconductor element 100 (FIG. 1 or FIG. 2), having a rear surface 202, a front surface 203, and pads 204 exposed at front surface 203 can then be positioned to overlie major surface 102 and conductive elements 106 of element 100, as shown in FIG. 6. The pads 204 can be juxtaposed with the conductive elements 106 at positions overlying the major surface 102 of the lower semiconductor element 100. Pads 204 are positioned to partly or fully overlie the major surface 102. However the pads 204 may partly overlie the openings 108. In one embodiment, the entirety of pads 204 overlie major surface 102 and not openings 108.

Figure 7:
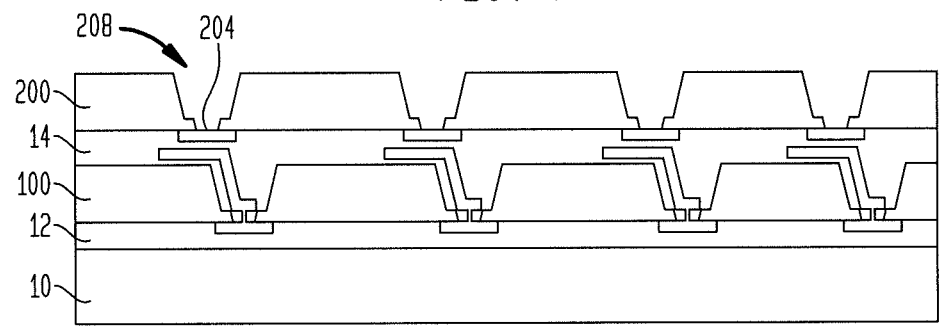
Figure 8:
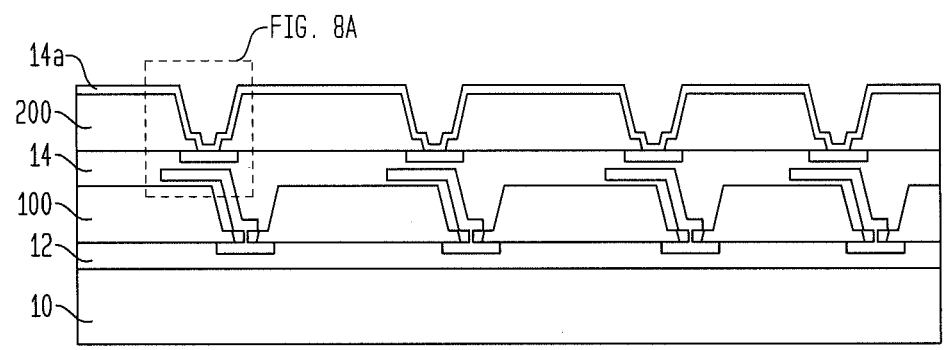
Figure 8A:
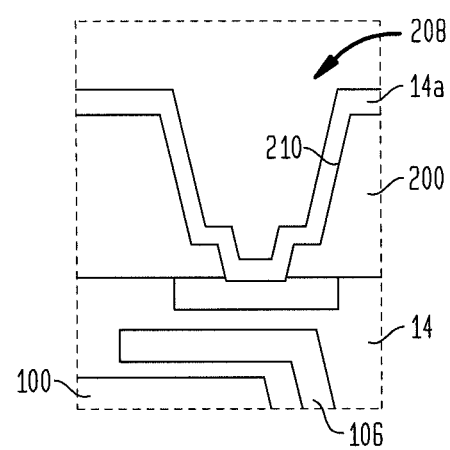
Figure 9:
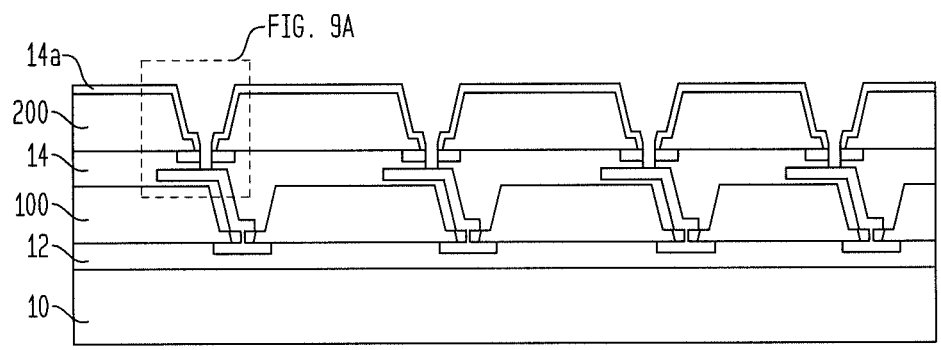
Figure 9A:
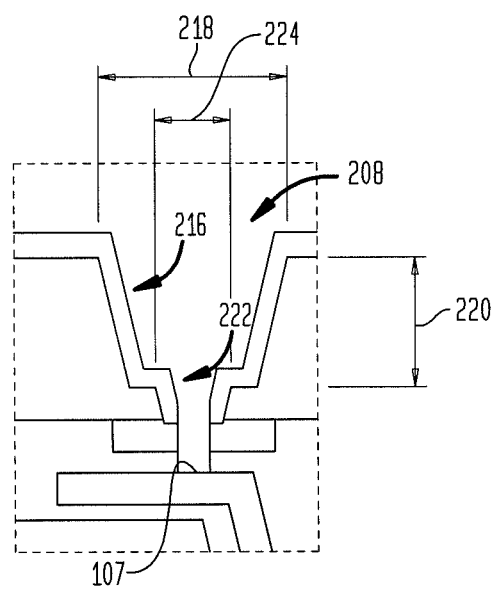
Figure 10:
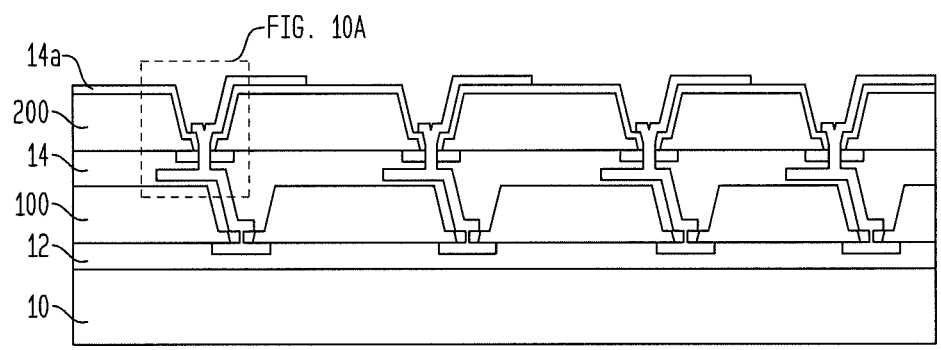
Figure 10A:
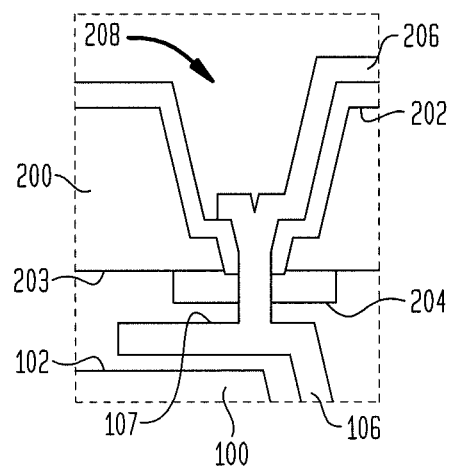

An opening 208 is formed in element 200 extending from rear surface 202 toward front surface 203, which can be in the same manner as the above-described opening 108. As shown in FIG. 7, openings 208 can expose pads 204 of element 200. In one example, dielectric layer 14*a* can be provided overlying rear surface 202 and interior surfaces 210 of openings 208, as shown in FIGS. 8 and 8*a*, after which opening 208 can be extended through conductive pads 204 to expose surfaces 107 of elements 106, as shown in FIGS. 9 and 9*a*, for example. A second electrically conductive element 206 is then provided to extend at least within opening 208, with conductive element 206 electrically contacting pad 204 and element 106, as shown in FIGS. 10 and 10*a*. A portion of conductive element 206 overlies rear surface 202 of element 200.

Figure 11:
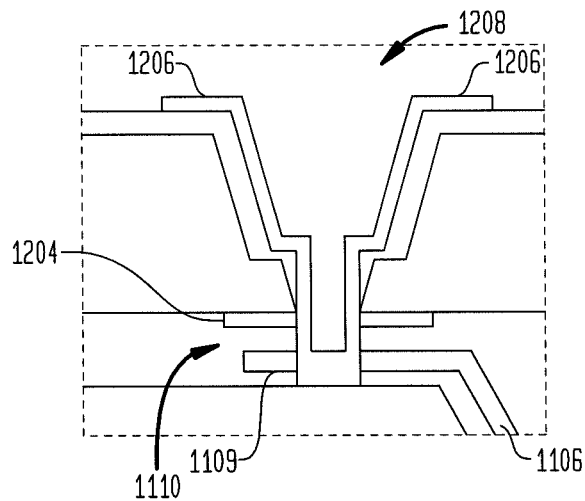
FIGS. 11-13 are front perspective views of alternatives to the structure shown in FIG. 10*a*.
Figure 12:
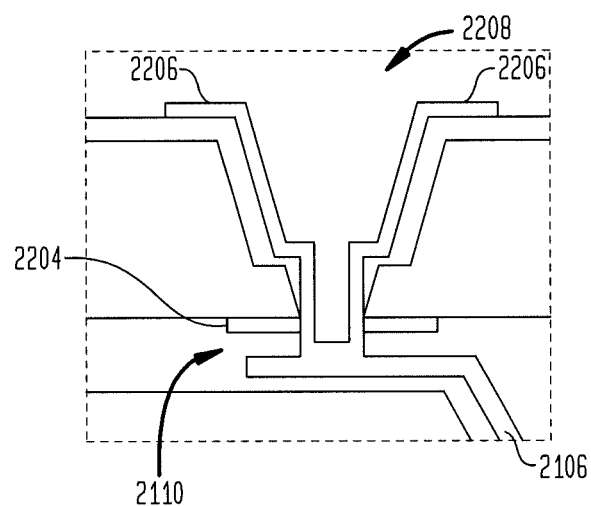
Figure 13:
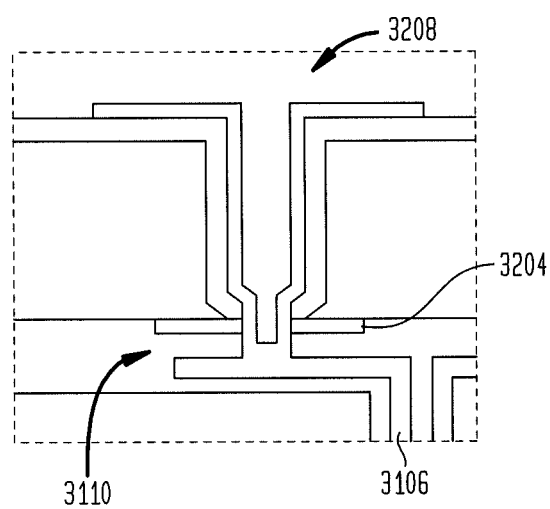

While FIG. 10*a* is shown with opening 208 exposing surface 107 of element 106, an opening 1208 may alternatively be formed through an element 1106 as shown in FIG. 11. In such a case, opening 1208 is formed through and an element 1206 extends beyond a surface 1109 of element 1106, and a gap 1110 is shown between pad 1204 and element 1106. In FIG. 12, a gap 2110 is shown between pad 2204 and element 2106. Two elements 2206 electrically contact pad 2204 and element 2106, with each element 2206 disposed on an opposing surface of an opening 2208. FIG. 13 depicts an embodiment in which an opening 3208 is narrow and include substantially parallel wall surfaces. A gap 3110 is also disposed between a pad 3204 and an element 3106.

The openings in the semiconductor elements have interior surfaces which can extend in directions normal to the major surface of the semiconductor elements or at an angle with respect to the normal direction to the semiconductor element major surface. Pads and conductive elements which are juxtaposed therewith may or may not have gaps therebetween. Further, while the openings may extend through conductive pads 206, they may not extend through the conductive elements which are juxtaposed therewith.

Figure 15:
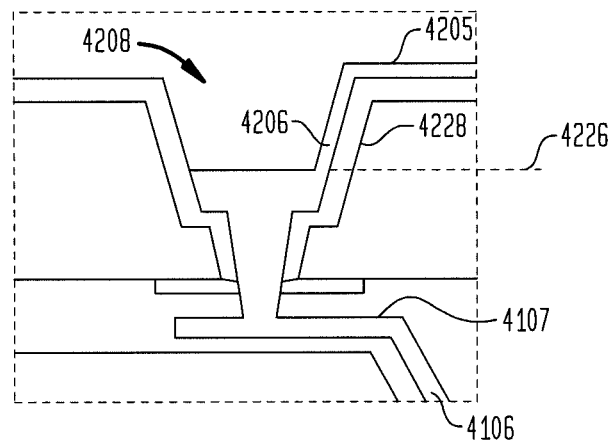
FIGS. 15-17 are front perspective views of alternatives to the structure shown in FIG. 10*a*.
Figure 16:
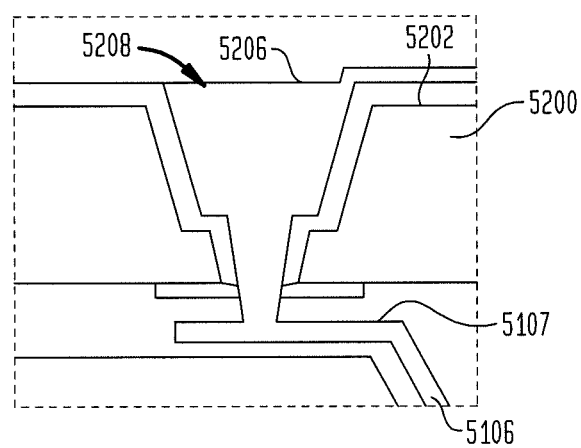
Figure 17:
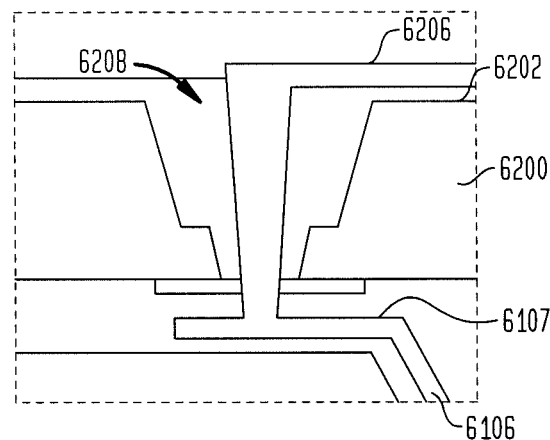

While conductive element 206 is shown as extending along a surface of opening 208, a conductive element according to the present invention may fill an opening with metal. As shown in FIG. 15, a conductive element 4206 fills an opening 4208 with metal from an exposed surface 4107 of a first conductive element 4106 to a height 4226 above exposed surface 4107. Conductive element 4206 includes a layer 4205 of metal extending beyond height 4226 along an interior surface 4228 of opening 4208. Layer 4205 partially occupies a space within opening 4208 above height 4226. Alternatively, as shown in FIG. 16, a conductive element 5206 fully fills an opening 5208 with metal from an exposed surface 5107 of a first conductive element 5106 to a rear surface 5202 of a second semiconductor element 5200. Of course, as described above, an opening as described herein, and the metal filling same, may extend from the pad of a semiconductor element toward the rear surface thereof or may extend through the conductive element of an adjacent semiconductor element. In yet another alternative embodiment shown in FIG. 17, an opening 6208 in a semiconductor element 6200 is filled with a dielectric and lased so that a second conductive element 6206 may extend from an exposed surface 6107 of a first conductive element 6106 to a rear surface 6202 of element 6200. Conductive element 6206 does not conform to the contours of opening 6208, but rather extends in a narrow vertical direction with respect to semiconductor element 6200.

As shown in FIG. 14, third and additional levels may be assembled to the assembly of FIG. 10, with such levels being constructed according to the above-described method with respect to element 200. For example, the third level includes an electrically conductive pad 304 exposed at a front surface 303 of a third semiconductor element 300. Pad 304 is juxtaposed with a portion of conductive element 206 overlying rear surface 202 of semiconductor element 200. An opening 308 extends through pad 304 and exposes a surface of conductive element 206. Alternatively, as discussed above, opening 308 may extend through conductive element 206. A third electrically conductive element 306 is plated extending at least within opening 308 and contacting pad 304 and conductive element 206. Pad 304 is positioned with respect to element 200 in the same manner that pad 204 is positioned with respect to element 100. That is, pad 304 preferably overlies rear surface 202 of element 200 and not opening 208, though some overlap with opening 208 is allowable. Among non-adjacent levels, it is often desirable to have pads overlie one another. As such, pad 304 may overlie pad 104 of semiconductor element 100, as shown in FIG. 14.

With reference to FIG. 9a, an opening in a semiconductor element, such as opening 208, may include a first opening 216 and a second opening 222. The first opening 216 can have a first width 218 and extends from rear surface 202 at least partially through a thickness 220 of opening 208. Second opening 222 extends from the first opening at least through pad 204 and has a second width 224 that is different from first width 218. As shown in FIG. 9a, second opening 222 extends toward surface 107 of conductive element 106, though second opening may only extend to pad 204. First opening 216 and second opening 222 meet at a location with in thickness 220 of element 200, and each may have a profile with parallel or slanted walls, or be configured otherwise.

FIG. 14 depicts an assembly according to the above described methods of construction. First semiconductor element 100 includes first conductive element 106 exposed at major surface 102. Second semiconductor element 200 includes front surface 203 juxtaposed with major surface 102 of semiconductor element 100 and has a plurality of active semiconductor devices therein. Conductive pad 204 is exposed at front surface 203 and overlies conductive element 106. Semiconductor element 200 further includes opening 208 extending from rear surface 202 through conductive pad 204 and exposing, or alternatively extending through, first conductive element 206. Second electrically conductive element 206, or a plated metal element, extends within opening 208 and electrically interconnects conductive pad 204 with conductive element 106. Of course, the assembly shown in FIG. 14 includes a third and a fourth level according to the above-described embodiments.

Figure 18:
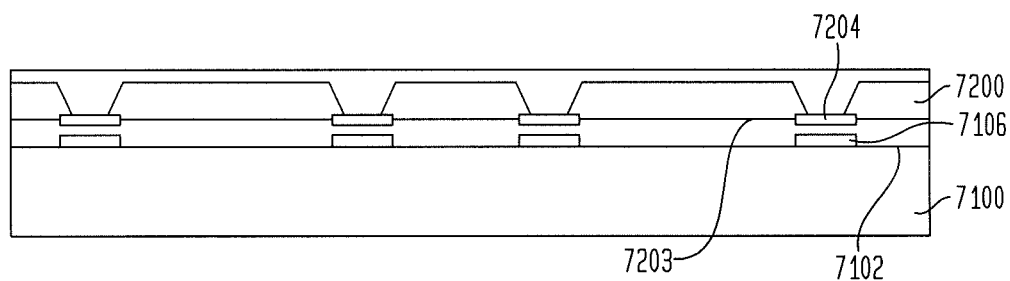
FIGS. 18 and 19 are front perspective views of an assembly showing various steps of making a structure in accordance with another embodiment of the present invention.
Figure 19:
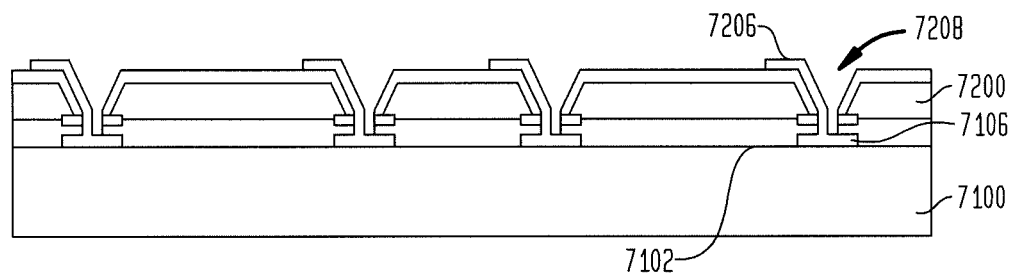

FIGS. 18 and 19 depict another embodiment including a first semiconductor element 7100 having a plurality of active semiconductor devices therein and a major surface 7102, or front surface. A conductive pad 7106 overlies major surface 7102. In alternative embodiments, pad 7106 may be comprised of a conductive element exposed at major surface 7102 and electrically connected with a conductive pad. In such example, the conductive element can be part of a redistribution layer formed in contact with the conductive pad 7106, such redistribution layer including an additional pad, a conductive trace or both. A second semiconductor element 7200 having a front surface 7203 and pads 7204 exposed at front surface 7203 is positioned to overlie major surface 7102 and conductive pads 7106 of element 7100. Pads 7204 are preferably positioned adjacent conductive pads 7106. As shown in FIG. 19, an electrically conductive element 7206 is plated through an opening 7208 in semiconductor element 7200 according to the above-described embodiments. With the base assembly shown in FIG. 19, additional levels may be constructed according also according to the above-described embodiments as desired.

The conductive elements herein described may be either conformal or non-conformal with a contour of an interior surface of the opening through which they are formed, such as by a plating process.

In certain embodiments, at least semiconductor element 200 has a plurality of active semiconductor devices disposed therein. In further embodiments, semiconductor element 100 also has a plurality of active semiconductor devices disposed therein.

FIGS. 20-24 depict another embodiment including a first semiconductor element 8100 having a plurality of active semiconductor devices therein. A conductive pad 8104 overlies a front surface 8103 of element 8100 and is disposed in an adhesive 8012, through which a carrier layer 8010 is attached to semiconductor element 8100. An opening 8108 is disposed in element 8100 according to the above-described embodiments, and a dielectric layer 8014 at least partly overlies an interior surface 8110 of opening 8108 and a major surface 8102 of element 8100.

Figure 21:
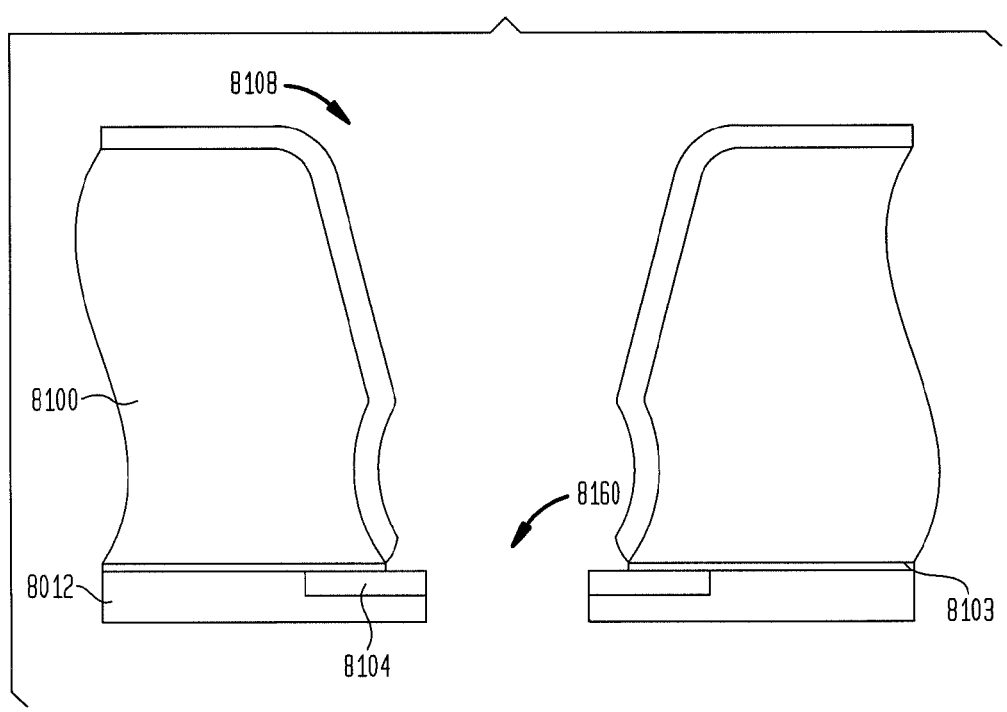

As shown in FIG. 21, first semiconductor element 8100 may be configured to have an opening 8160 formed through pad 8104. Opening 8160 can be formed by use of a laser, an etching process, a sandblasting process, a mechanical milling process, or any similar method. As shown in FIG. 21, opening 8160 is formed by a laser, as evidenced by the fact that its width is narrower than the width between the interior surfaces of opening 8108 adjacent pad 8104. If an etching process is utilized, the edges of a dielectric layer overlying the interior surfaces of opening 8108 can define the dimensions of opening 8160 in pad 8104. Mechanical milling can include a small diameter element, which can be referred to as a hammer, repeatedly striking pad 8104 and adhesive 8012 to loosen and remove such material. A sandblasting process can be utilized with a metal stencil, in which a dielectric region and a sacrificial layer can be positioned overlying first semiconductor element 8100 and within opening 8108. The metal stencil can be positioned to overlie the sacrificial layer 720 and includes openings which are shaped in accordance with opening 8160. A sand-based material is directed at first semiconductor element 8100 wherein the sand-based material strikes the sacrificial layer and dielectric region in the areas exposed through the openings in the metal stencil, thereby causing opening 8160 to form.

Figure 22:
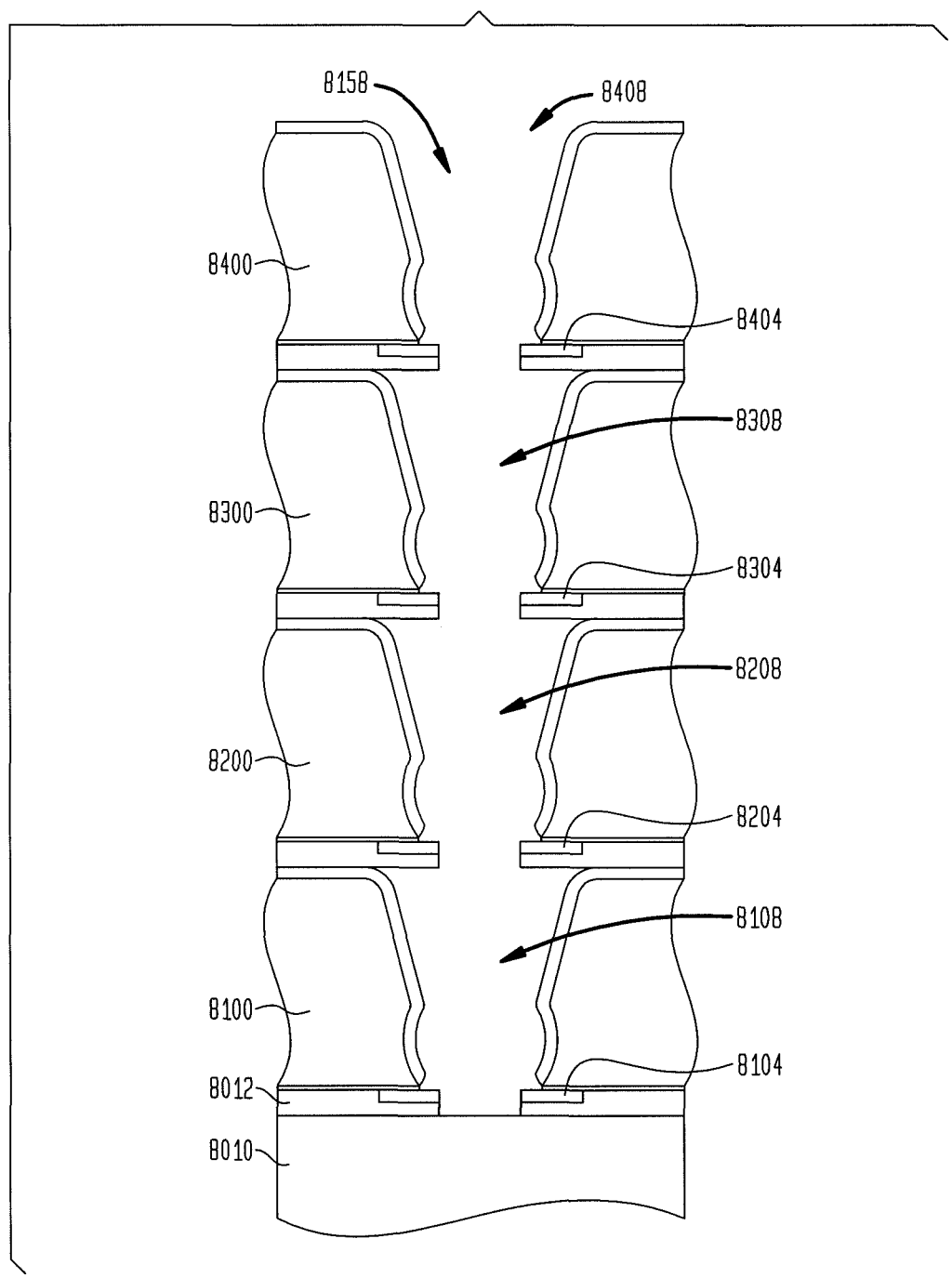
Figure 23:
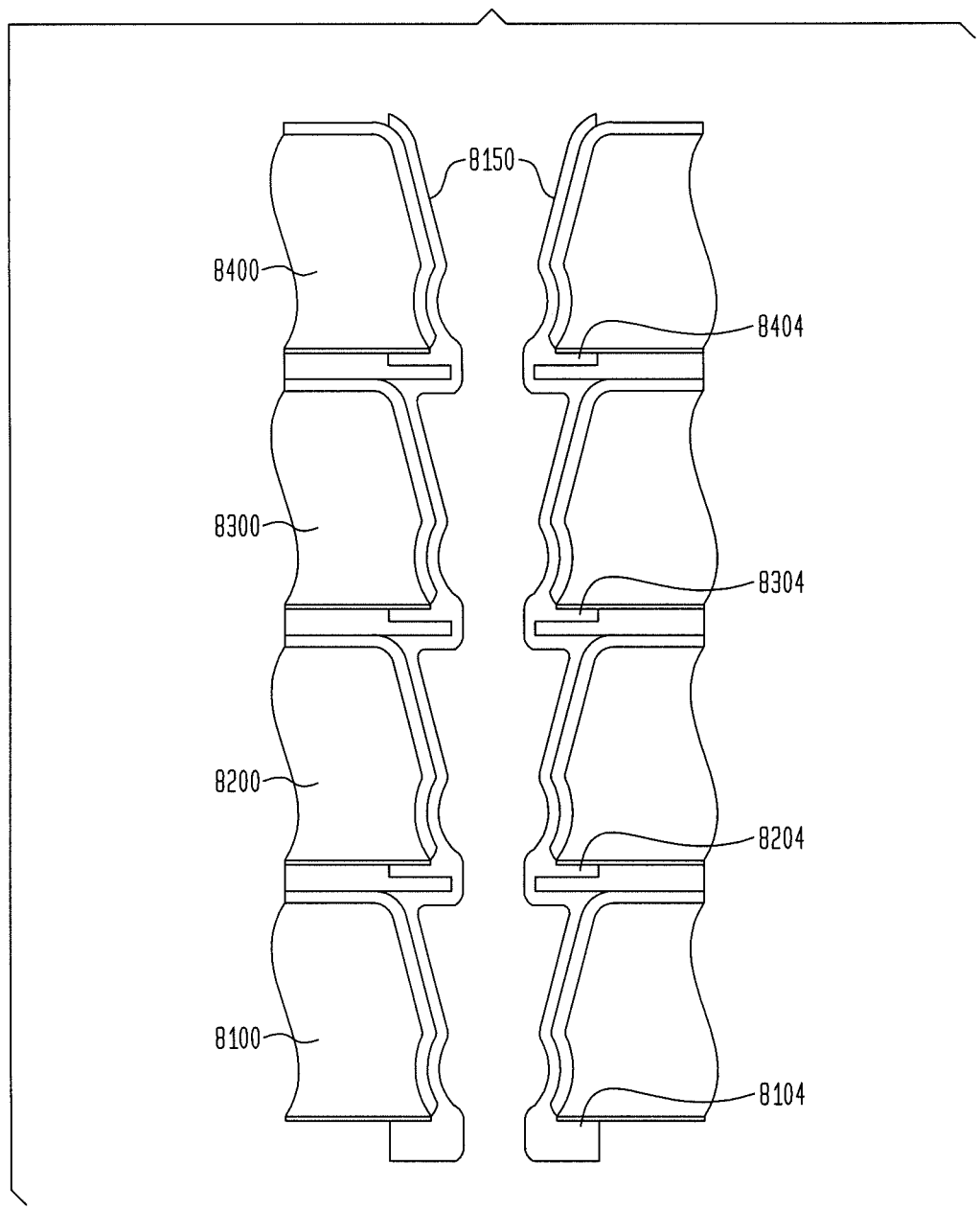

Two or more semiconductor elements, such as first semiconductor element 8100 shown in FIG. 21, can be stacked to form an assembly as shown in FIG. 22. A second semiconductor element 8200 substantially similar to first semiconductor element 8100 is positioned to overlie major surface 8102, with an opening 8208 and pad 8204 substantially aligned with and overlying opening 8108 and pad 8104. In this manner, third and fourth semiconductor elements 8300, 8400, having respective pads 8304, 8404 and openings 8308, 8408 are similarly stacked and aligned.

Figure 20:
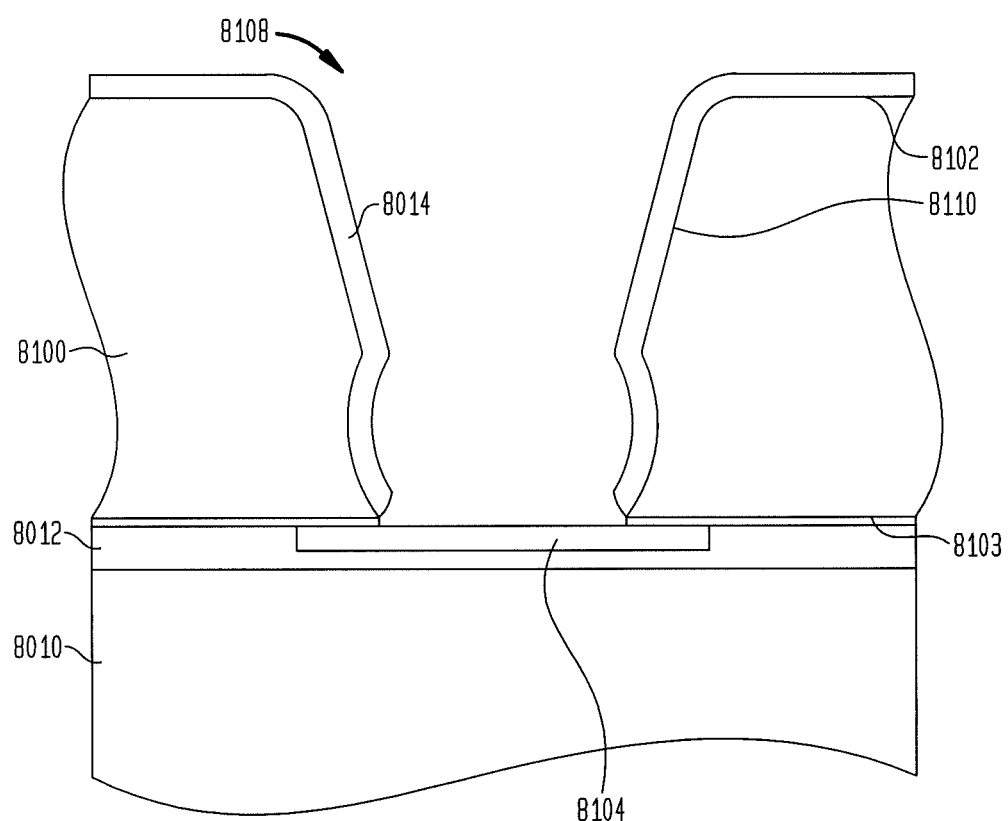
FIGS. 20-23 are front perspective views of an assembly showing various steps of making a structure in accordance with another embodiment of the present invention.

While it is preferable that the assembly shown in FIG. 22 is assembled with respective holes already formed through pads 8104, 8204, 8304, 8404, one continuous opening 8158 may be provided instead after assembling the individual semiconductor elements. As shown in FIG. 22, one continuous opening 8158 is shown essentially comprising openings 8108, 8208, 8308, 8408. A conductive material 8150, which may be comprised of copper for example, can then be deposited or plated onto the exposed surfaces of the continuous opening 8158 and in electrical connection with pads 8104, 8204, 8304, 8404. The continuous opening may then be filled with a dielectric material 8152, and additional metal may be deposited to overlie dielectric material 8152. Alternatively, as shown in FIG. 24a, the assembly may be formed with the bottom most semiconductor element 8100 having pad 8104 free from an opening such as opening 8160. Thus, semiconductor element 8100 is formed as shown in FIG. 20, and additional semiconductor elements are stacked atop in a manner as described above.

In a further embodiment shown in FIGS. 25-28, a first semiconductor element 9100 is shown having a plurality of active semiconductor devices therein. A conductive pad 9104 overlies a front surface 9103 of element 9100 and is disposed in an adhesive 9012, through which a carrier layer 9010 is attached to semiconductor element 9100. An opening 9108 is disposed in element 9100 according to the above-described embodiments, and a dielectric material 9154 fills opening 9108 and at least partly overlies a major surface 9102 of element 9100.

As shown in FIG. 26, a second semiconductor element 9200 substantially similar to first semiconductor element 9100 is positioned to overlie major surface 9102, with an opening 9208 and pad 9204 substantially aligned with and overlying opening 9108 and pad 9104. In this manner, third and fourth semiconductor elements 9300, 9400, having respective pads 9304, 9404 and openings 9308, 9408 are similarly stacked and aligned. Each of openings 9208, 9308, 9408 are filled with a respective dielectric material 9254, 9354, 9454 that also at least partly overlies the respective major surface of the semiconductor element.

After assembling the above described-structure, a portion of each of the respective dielectric materials, pads, and adhesive layers can be lased. As shown in FIG. 27, this forms one continuous opening 9158, essentially comprising openings 9108, 9208, 9308, 9408. A conductive material 9150, which may be comprised of copper for example, can then be plated or deposited into opening 9158 and in electrical connection with pads 9104, 9204, 9304, 9404.

In particular embodiments discussed above, the resulting assemblies can be or include a microelectronic unit having active circuit elements, e.g., transistors, diodes, or other microelectronic or microelectromechanical devices therein, among others, and have traces formed non-photolithographically as described above. Also in certain embodiments discussed above, the resulting assemblies can be or include an interposer structure having a substrate of at least one of semiconductor or dielectric material which has traces formed non-photolithographically as described above but which does not have active circuit elements therein. An interposer structure or component in accordance such embodiments can have conductive elements exposed at one or more of the front and rear faces for interconnection with one or more external components such as, for example, a microelectronic element, substrate or circuit panel.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, a system 900 in accordance with a further embodiment of the invention includes a structure 906 as described above in conjunction with other electronic components 908 and 910. In the example depicted, component 908 is a semiconductor chip whereas component 910 is a display screen, but any other components can be used. Of course, although only two additional components are depicted in FIG. 29 for clarity of illustration, the system may include any number of such components. The structure 906 as described above may be, for example, a composite chip or a structure incorporating plural chips. In a further variant, both may be provided, and any number of such structures may be used. Structure 906 and components 908 and 910 are mounted in a common housing 901, schematically depicted in broken lines, and are electrically interconnected with one another as necessary to form the desired circuit. In the exemplary system shown, the system includes a circuit panel 902 such as a flexible printed circuit board, and the circuit panel includes numerous conductors 904, of which only one is depicted in FIG. 29, interconnecting the components with one another. However, this is merely exemplary; any suitable structure for making electrical connections can be used. The housing 901 is depicted as a portable housing of the type usable, for example, in a cellular telephone or personal digital assistant, and screen 910 is exposed at the surface of the housing. Where structure 906 includes a light-sensitive element such as an imaging chip, a lens 911 or other optical device also may be provided for routing light to the structure. Again, the simplified system shown in FIG. 29 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a stacked microelectronic assembly comprising the steps of:
   (a) stacking a first semiconductor element atop a second semiconductor element, each of the first and second semiconductor elements having a front surface, a rear surface remote from the front surface, and a conductive pad exposed at the front surface, a first opening extending from the rear surface towards the front surface, and a second opening extending from the first opening at least to the respective conductive pad, the first and second openings having respective interior surfaces extending at nonzero angles relative to each other, wherein at least the second opening of the first semiconductor element extends through the conductive pad of the first semiconductor element, and the conductive pad of the first semiconductor element overlies the conductive pad of the second semiconductor element; and then
   (b) depositing an electrically conductive material onto a surface below and through the conductive pad of the second semiconductor element and within the first and second openings of each semiconductor element to form an electrically conductive element extending through the first and second openings of each of the first and second semiconductor elements, the conductive element conforming to contours of the interior surfaces of the first and second openings and electrically connecting the conductive pads.

2. The method of claim 1, wherein each of the conductive pads of the first and second semiconductor elements has a bottom surface adjacent the second opening of the respective semiconductor element, and the conductive element contacts the bottom surface of each of the respective conductive pads.

3. The method of claim 1, wherein the conductive pad of at least the first semiconductor element has an inner surface exposed within the second opening, the inner surface extending from a bottom surface of the conductive pad adjacent the second opening to a top surface thereof remote from the bottom surface, wherein the conductive element contacts the inner surface of the conductive pad of at least the first semiconductor element.

4. The method of claim 1, wherein a dielectric material at least partly overlies the interior surfaces of the first and second openings of each of the first and second semiconductor elements.

5. The method of claim 4, wherein the dielectric material is a polymeric material.

6. The method of claim 4, wherein step (b) includes removing a portion of the dielectric material by a method including at least one of: mechanical milling, sandblasting, or directing a laser toward at least a portion of the interior surfaces of the first and second openings to ablate a portion of the dielectric material and a portion of a sacrificial layer.

7. The method of claim 1, wherein step (b) includes filling the first and second openings of each of the first and second semiconductor elements with the electrically conductive element.

8. The method of claim 1, wherein step (b) includes forming a metal layer lining the first and second openings of the second semiconductor element, and forming a dielectric layer overlying the metal layer within the first and second openings, the metal layer extending at least partially through the conductive pad of the second semiconductor element.

9. The method of claim 8, wherein the metal layer extends through the entire thickness of the conductive pad of the second semiconductor element.

10. The method of claim 1, wherein at least the first semiconductor element has a plurality of active semiconductor devices disposed therein.

11. The method of claim 10, wherein the second semiconductor element has a plurality of active semiconductor devices disposed therein.

12. A method of forming a stacked microelectronic assembly comprising the steps of:
   (a) stacking a first semiconductor element atop a second semiconductor element, each of the first and second semiconductor elements having a front surface, a rear surface remote from the front surface, and a conductive pad exposed at the front surface and separated from a semiconductor layer of the semiconductor element by a dielectric layer, a first opening extending from the rear surface towards the front surface, and a second opening extending from the first opening and exposing a portion of the dielectric layer adjacent to the respective conductive pad, the first and second openings having respective interior surfaces extending at angles relative to each other, and a dielectric region at least substantially filling the first and second openings, wherein the conductive pad of the first semiconductor element overlies the conductive pad of the second semiconductor element;
   (b) forming a third opening extending through the dielectric region within the first and second openings and extending through the conductive pad of at least the first semiconductor element; and
   (c) forming an electrically conductive element extending through the third opening, the conductive element electrically connecting the conductive pads.

13. The method of claim 12, wherein the conductive pad of at least the first semiconductor element has an inner surface exposed within the second opening, the inner surface extending from a bottom surface of the conductive pad adjacent the second opening to a top surface thereof remote from the bottom surface, the conductive element contacting the inner surface of the conductive pad of at least the first semiconductor element.

14. The method of claim 12, wherein at least a portion of the conductive element does not conform to a contour of the respective interior surfaces of the first and second openings in the respective first and second semiconductor elements.

15. The method of claim 12, wherein the dielectric region is a polymeric material.

16. The method of claim 12, wherein step (b) includes removing a portion of the dielectric region by a method including at least one of: mechanical milling, sandblasting, or directing a laser toward at least a portion of the interior surfaces of the first and second openings to ablate a portion of the dielectric region and a portion of a sacrificial layer.

17. The method of claim 12, wherein step (c) includes filling the third opening with the electrically conductive element.

18. The method of claim 12, wherein step (c) includes forming a metal layer lining the third opening, and forming a dielectric layer overlying the metal layer within the third opening, the metal layer extending at least partially through the conductive pad of the second semiconductor element.

19. The method of claim 18, wherein the metal layer extends through the entire thickness of the conductive pad of the second semiconductor element.

20. The method of claim 12, wherein at least the first semiconductor element has a plurality of active semiconductor devices disposed therein.

21. The method of claim 20, wherein the second semiconductor element has a plurality of active semiconductor devices disposed therein.

22. A method of forming a stacked microelectronic assembly comprising the steps of:
  (a) stacking a first semiconductor element atop a second semiconductor element, each of the first and second semiconductor elements having a front surface, a rear surface remote from the front surface, and a conductive pad exposed at the front surface and separated from a semiconductor layer of the semiconductor element by a dielectric layer, a first opening extending from the rear surface towards the front surface, and a second opening extending from the first opening and exposing a portion of the dielectric layer adjacent to the respective conductive pad, the first and second openings having respective interior surfaces extending at angles relative to each other, wherein at least the second opening of the first semiconductor element extends through the conductive pad of the first semiconductor element, and the conductive pad of the first semiconductor element overlies the conductive pad of the second semiconductor element; and
  (b) forming an electrically conductive element extending through the first and second openings of each of the first and second semiconductor elements, the conductive element conforming to contours of the interior surfaces of the first and second openings and electrically connecting the conductive pads.

23. An assembly comprising:
  a first semiconductor element stacked atop a second semiconductor element, each of the first and second semiconductor elements having a front surface, a rear surface remote from the front surface, and a conductive pad exposed at the front surface, a first opening extending from the rear surface towards the front surface, and a second opening extending from the first opening at least to the respective conductive pad, the first and second openings having respective interior surfaces extending at nonzero angles relative to each other, wherein at least the second opening of the first semiconductor element extends through the conductive pad of the first semiconductor element, and the conductive pad of the first semiconductor element overlies the conductive pad of the second semiconductor element; and
  a monolithic electrically conductive element extending through the first and second openings of each of the first and second semiconductor elements, the conductive element conforming to contours of the interior surfaces of the first and second openings and electrically connecting the conductive pads.

24. The assembly of claim 23, wherein each of the conductive pads of the first and second semiconductor elements has a bottom surface adjacent the second opening of the respective semiconductor element, and each of the conductive element contacts the bottom surface of the respective conductive pad.

25. The assembly of claim 23, wherein the conductive pad of at least the first semiconductor element has an inner surface exposed within the second opening, the inner surface extending from a bottom surface of the conductive pad adjacent the second opening to a top surface thereof remote from the bottom surface, wherein the conductive element contacts the inner surface of the conductive pad of at least the first semiconductor element.

26. The assembly of claim 23, wherein a dielectric material at least partly overlies the interior surfaces of the first and second openings of each of the first and second semiconductor elements.

27. The assembly of claim 26, wherein the dielectric material is a polymeric material.

28. The assembly of claim 23, wherein the electrically conductive element substantially fills the first and second openings of each of the first and second semiconductor elements.

29. The assembly of claim 23, further comprising a metal layer lining the first and second openings of the second semiconductor element, and a dielectric layer overlying the metal layer within the first and second openings, the metal layer extending at least partially through the conductive pad of the second semiconductor element.

30. The assembly of claim 29, wherein the metal layer extends through the entire thickness of the conductive pad of the second semiconductor element.

31. The assembly of claim 23, wherein the second semiconductor element includes a plurality of active semiconductor devices.

32. A system comprising an assembly according to claim 23 and one or more other electronic components electrically connected to the assembly.

33. A system as claimed in claim 32 further comprising a housing, the assembly and the other electronic components being mounted to the housing.

34. An assembly comprising:
  a first semiconductor element stacked atop a second semiconductor element, each of the first and second semiconductor elements having a front surface, a rear surface remote from the front surface, and a conductive pad exposed at the front surface and separated from a semiconductor layer of the semiconductor element by a dielectric layer, a first opening extending from the rear surface towards the front surface, and a second opening extending from the first opening and exposing a portion of the dielectric layer adjacent to the respective conductive pad, the first and second openings having respective interior surfaces extending at angles relative to each other, the conductive pad of the first semiconductor element overlying the conductive pad of the second semiconductor element;
  a dielectric region at least substantially filling the first and second openings;
  a third opening extending through the dielectric region within the first and second openings and extending through the conductive pad of at least the first semiconductor element; and
  an electrically conductive element extending through the third opening, the conductive element electrically connecting the conductive pads.

35. The assembly of claim 34, wherein the conductive pad of at least the first semiconductor element has an inner surface exposed within the second opening, the inner surface extending from a bottom surface of the conductive pad adjacent the second opening to a top surface thereof remote from the bottom surface, the conductive element contacting the inner surface of the conductive pad of at least the first semiconductor element.

36. The assembly of claim 34, wherein at least a portion of the conductive element does not conform to a contour of the respective interior surfaces of the first and second openings in the respective first and second semiconductor elements.

37. The assembly of claim 34, wherein the dielectric region is a polymeric material.

38. The assembly of claim 34, wherein the electrically conductive element substantially fills the third opening.

39. The assembly of claim 34, further comprising a metal layer lining the third opening, and a dielectric layer overlying the metal layer within the third opening, the metal layer extending at least partially through the conductive pad of the second semiconductor element.

40. The assembly of claim 39, wherein the metal layer extends through the entire thickness of the conductive pad of the second semiconductor element.

41. The assembly of claim 34, wherein the second semiconductor element includes a plurality of active semiconductor devices.

42. A system comprising an assembly according to claim 34 and one or more other electronic components electrically connected to the assembly.

43. A system as claimed in claim 42 further comprising a housing, the assembly and the other electronic components being mounted to the housing.

44. The method of claim 12, wherein the interior surfaces of the respective first and second openings extend at nonzero angles relative to each other.

45. The method of claim 22, wherein the interior surfaces of the respective first and second openings extend at nonzero angles relative to each other.

46. The assembly of claim 34, wherein the interior surfaces of the respective first and second openings extend at nonzero angles relative to each other.

47. The method of claim 1, wherein the interior surface of at least one of the first and second openings is curved.

48. The assembly of claim 23, wherein the interior surface of at least one of the first and second openings is curved.

49. The method of claim 1, wherein at a junction of the interior surfaces of the first and second openings, the interior surface of the first opening converges in a direction extending from the rear surface to the front surface, and the interior surface of the second opening diverges in said direction.

50. The assembly of claim 23, wherein at a junction of the interior surfaces of the first and second openings, the interior surface of the first opening converges in a direction extending from the rear surface to the front surface, and the interior surface of the second opening diverges in said direction.

* * * * *